(12) United States Patent
Austin et al.

(10) Patent No.: US 6,831,328 B2
(45) Date of Patent: Dec. 14, 2004

(54) ANODE VOLTAGE SENSOR OF A VERTICAL POWER COMPONENT AND USE FOR PROTECTING AGAINST SHORT CIRCUITS

(75) Inventors: Patrick Austin, Bonrepos-Riquet (FR); Jean-Pierre Laur, Albi (FR); Olivier Causse, Onet le Chateau (FR); Marie Breil, Toulouse (FR); Jean-Louis Sanchez, Escalquens (FR); Jean Jalade, Castanet-Tolosan (FR)

(73) Assignee: Centre National de la Recherche Scientifique, Paris Cedex (FR)

( * ) Notice: Subject to any disclaimer, the term of this patent is extended or adjusted under 35 U.S.C. 154(b) by 0 days.

(21) Appl. No.: 10/275,848

(22) PCT Filed: May 9, 2001

(86) PCT No.: PCT/FR01/01402

§ 371 (c)(1),
(2), (4) Date: May 16, 2003

(87) PCT Pub. No.: WO01/86728

PCT Pub. Date: Nov. 15, 2001

(65) Prior Publication Data

US 2003/0174008 A1 Sep. 18, 2003

(30) Foreign Application Priority Data

May 11, 2000 (FR) .............................................. 00 06026

(51) Int. Cl.[7] .............................................. H01L 29/78
(52) U.S. Cl. .................. 257/328; 257/356; 257/341; 257/262; 257/266; 257/136; 257/173; 361/101
(58) Field of Search ................................. 257/328, 356, 257/262, 266, 341, 136, 173; 361/101

(56) References Cited

U.S. PATENT DOCUMENTS 4,896,196 A * 1/1990 Blanchard et al. .......... 257/139

5,075,751 A 12/1991 Tomii et al. .................. 357/38
6,137,124 A * 10/2000 Michel et al. ............... 257/263

FOREIGN PATENT DOCUMENTS

| EP | 0 029 932 | 6/1981 |
| EP | 0 872 894 A | 10/1998 |
| FR | 2 532 503 | 3/1984 |
| FR | 2 766 993 | 2/1999 |

OTHER PUBLICATIONS

"Bipolar Static Induction Transistor (BSIT) Static Model", Proceedings of the Mediterannean Electrotechnical Conference, US, New York, IEEE, Ionescu A M et al., vol. conf. 6, May 22, 1991, pp. 107–110, XP000255352, Figure 1.

"A Novel Pulse Delay Circuit for converter Control", P.B. Anjaneyulu et al., Int. J. Electronics, vol. 50, No. 6, 1981, pp. 477–484, XP000946269.

"Trends in Power Semiconductor Devices", B. Jayant Baliga, IEEE Transactions on Electron Devices, IEEE Inc., New York, US, vol. 43, No. 10, Oct. 1, 1996, pp. 1717–1731, XP000626907.

"Time Delay Circuit for S.C.R. Control", R. Arockiasamy, Electronic Engineering, vol. 46, No. 556, Jun. 1974, pp. 14–17, XP000951463.

* cited by examiner

Primary Examiner—Jerome Jackson
(74) Attorney, Agent, or Firm—Duane Morris LLP

(57) ABSTRACT

The invention concerns an anode voltage sensor of a vertical power component selected from the group consisting of components called thyristor, MOS, IGBT, PMCT, EST, BRT transistor, MOS thyristor, turn-off MOS thyristor, formed by a lightly doped N-type substrate (1) whereof the rear surface (2) having a metallizing coat corresponds to the component anode. Said sensor comprises, on the front surface side, a substrate zone (12) surrounded at least partly by a P-type region with low potential in front of an anode potential, said zone (12) being coated with a metallizing coat (M) in ohmic contact with it, whereon is provided an image of the anode voltage.

4 Claims, 5 Drawing Sheets

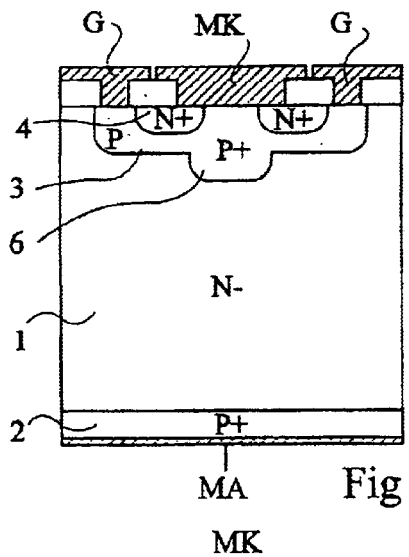
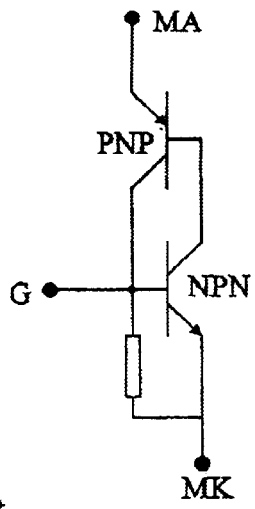
Fig 1A Prior Art
Fig 1B Prior Art
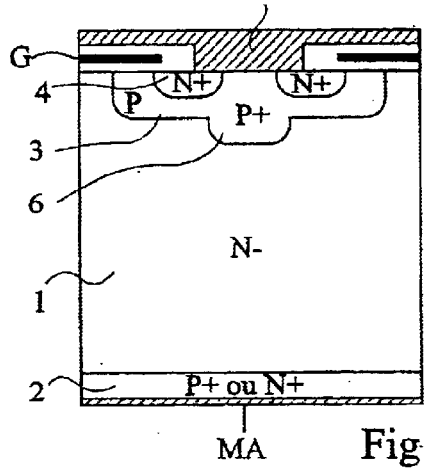
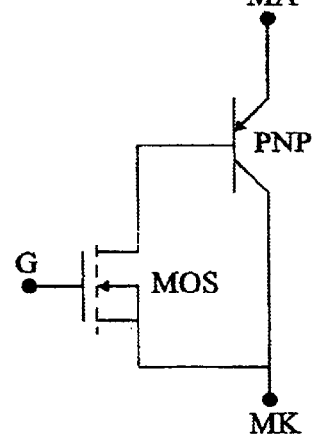
Fig 2A Prior Art
Fig 2B Prior Art
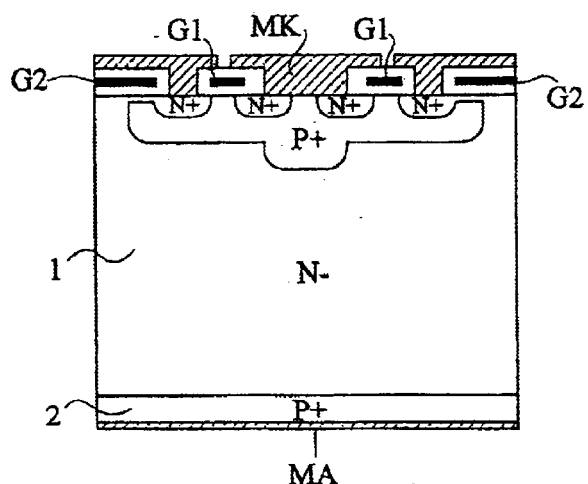
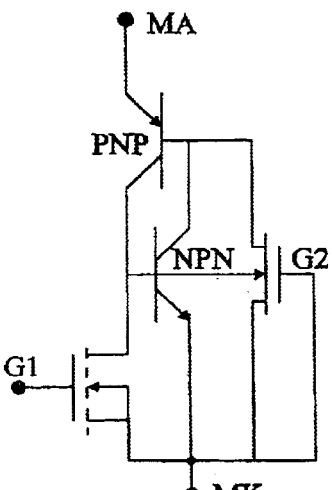
Fig 3A Prior Art
Fig 3B Prior Art

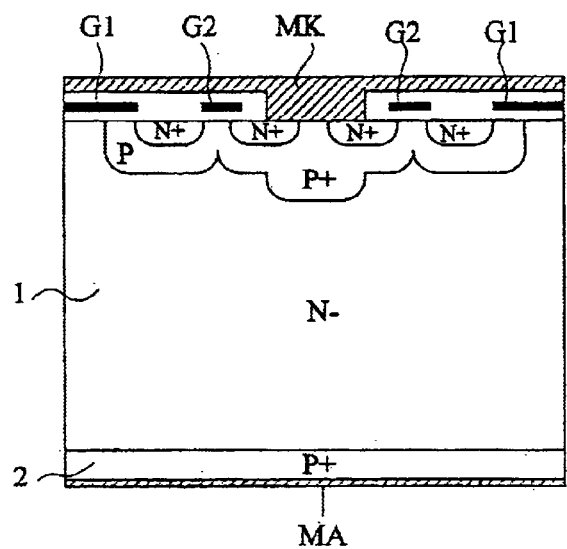
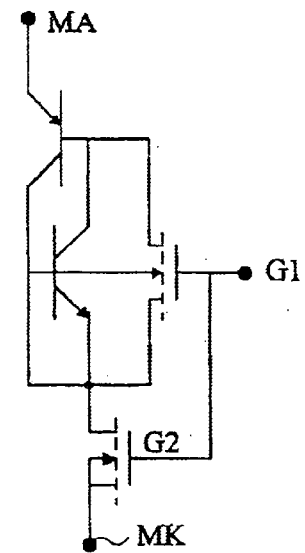
Fig 4A
Prior Art
Fig 4B
Prior Art
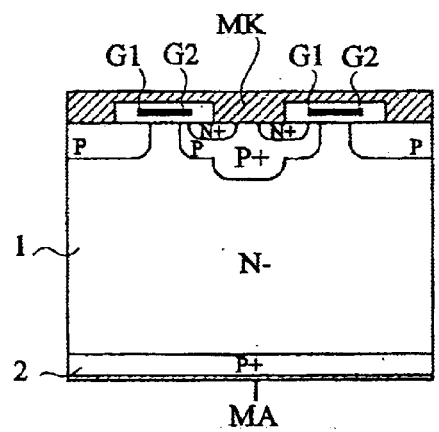
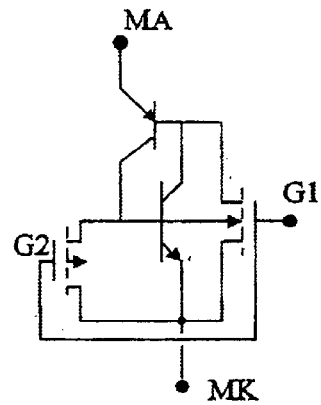
Fig 5A
Prior Art
Fig 5B
Prior Art

ANODE VOLTAGE SENSOR OF A VERTICAL POWER COMPONENT AND USE FOR PROTECTING AGAINST SHORT CIRCUITS

The present invention generally relates to vertical power components. It more specifically relates to the provision of a voltage linked to the anode voltage of such a component.

Generally, in vertical power components, the rear surface is uniformly metallized and corresponds to the anode of the component, while the front surface comprises a cathode metallization and one or several control terminals. Generally, the anode is brought to a high voltage and it may be useful to have a detection voltage varying in the same way as the anode voltage.

FIGS. 1A to 5A show simplified cross-section views of various examples of vertical power components of cellular type. FIGS. 1B to 5B show equivalent diagrams. In all cases, it is considered that the structure is formed from a lightly-doped N-type substrate 1.

FIG. 1A shows a cross-section view of a cell of a cellular-type thyristor. On the rear surface side of substrate 1 is formed a P-type layer 2 corresponding to the anode layer and coated with an anode metallization MA. On the front surface side is formed a P-type well 3, in which are formed heavily-doped N-type cathode regions 4. Preferably, the central portion of each well comprises a heavily-doped P-type region 6. A cathode metallization MK is integral with regions 4 and 6 and a gate metallization G is integral with well 3.

FIG. 1B shows the conventional equivalent diagram of a thyristor formed of the association of two PNP and NPN transistors. In FIG. 1B as in FIGS. 2B to 5B, the anode is shown at the top of the drawing, while in the cross-section views of FIGS. 1A to 5A, the anode is shown at the bottom of the drawing.

FIG. 2A shows a cross-section view of vertical MOS transistors or of an IGBT transistor. In the case of a MOS-type transistor, rear surface layer 2 is of type $N^+$. In the case of an IGBT transistor, rear surface layer 2 is of type $P^+$. The structure diffused on the front surface side is similar to that of a cellular thyristor and comprises a P-type well 3, an $N^+$-type region 4, and a $P^+$-type region 6. Cathode metallization MK is similar to that of FIG. 1A. The control electrode corresponds to a gate metallization G isolated from the periphery of well 3 and formed thereabove. FIG. 2B shows the equivalent diagram in the case where layer 2 is of type $P^+$, that is, where the component is an IGBT transistor. This structure comprises the association of a PNP transistor and of an enrichment MOS transistor connected between the base and the collector of the PNP transistor.

FIGS. 3A and 3B show a gate turn-on and turn-off MOS thyristor.

FIGS. 4A and 4B show a structure of an emitter-switched thyristor, currently called an EST structure.

FIGS. 5A and 5B show a cross-section view of a base-resistor thyristor, currently designated as a BRT.

Figure 6:
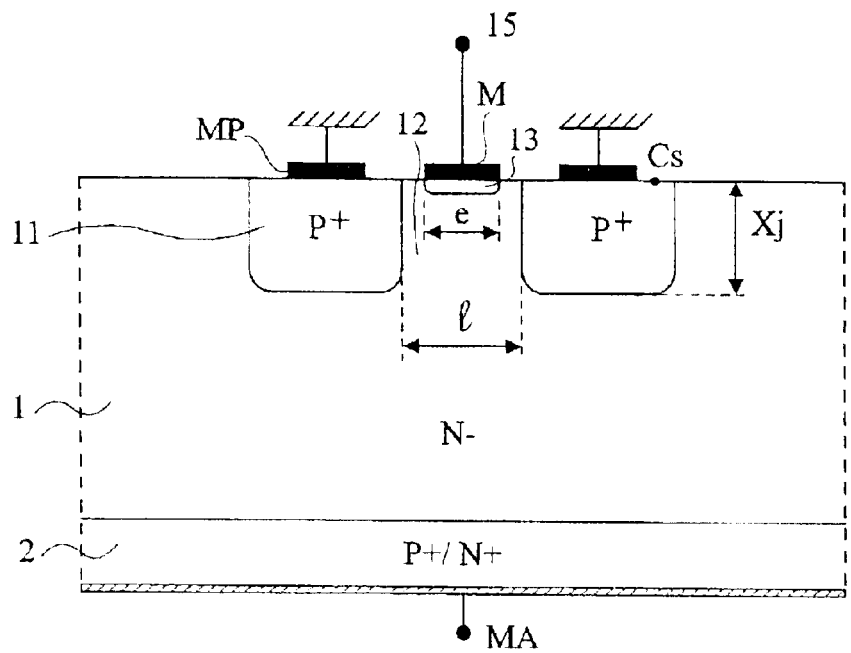

FIGS. 3 to 5 will not be described in more detail, and it should only be noted that a $P^+$-type layer 2 coated with an anode metallization MA is provided on the rear surface side. To simplify the understanding of these structures, the gates of the MOS transistors implied in FIGS. 3A, 4A and 5A have been designated as G1 and G2, and these gates have been designated in the same way in the equivalent diagrams of the corresponding FIGS. 3B, 4B, and 5B. For further details, reference can be made to "Trends in Power Semiconductor Devices", B. J. Baliga, IEEE Transactions on Electron Devices, vol. 43, October 1996, pp. 1717–1731.

FIGS. 1 to 5 have only been described to remind the structure of a few examples of vertical components to which the present invention is likely to apply.

The object of the present invention is to provide a voltage sensor likely to provide, on a front surface electrode of the component, a voltage much lower than the anode voltage, but varying in the same direction as this anode voltage. In other words, a voltage which is the image of the anode voltage is desired to be obtained.

To achieve this object, the present invention provides a sensor of an anode voltage of vertical power component selected from the group comprising the so-called thyristor, MOS, IGBT, PMCT, EST, BRT transistor, MOS thyristor, gate turn-off MOS thyristor, formed in a lightly-doped N-type substrate and having its rear surface, coated with a metallization, which corresponds to the anode of the component, comprising, on the front surface side, an area of the substrate surrounded at least partially with a P-type region at a low voltage as compared to an anode voltage, said area being coated with a metallization in ohmic contact therewith, on which is provided an image of the anode voltage.

According to an embodiment of the present invention, the metallization is formed on a heavily-doped N-type region.

According to an embodiment of the present invention, the anode metallization is formed on a $P^+$-type region.

Further, the present invention aims at a specific use of such a sensor to detect whether the load connected to the power component is in short-circuit.

The present invention also provides a use of the above-mentioned anode voltage sensor to inhibit the operation of a vertical power component when the detected voltage exceeds a predetermined threshold.

The present invention also provides a circuit for controlling the turning-off of a vertical power component comprising a voltage sensor such as mentioned hereabove, the output voltage of which is applied to the control terminal of a switch connected between the cathode and the control terminal of a vertical power component that can be turned off when this control terminal is connected to the cathode, a delay circuit being interposed between the sensor voltage and the gate terminal.

According to an embodiment of the present invention, the delay circuit comprises a MOS transistor, the gate of which receives the signal from the sensor and the main circuit of which is connected between the gate of said switch and a resistor connected to the control terminal of the vertical component.

Figure 7:
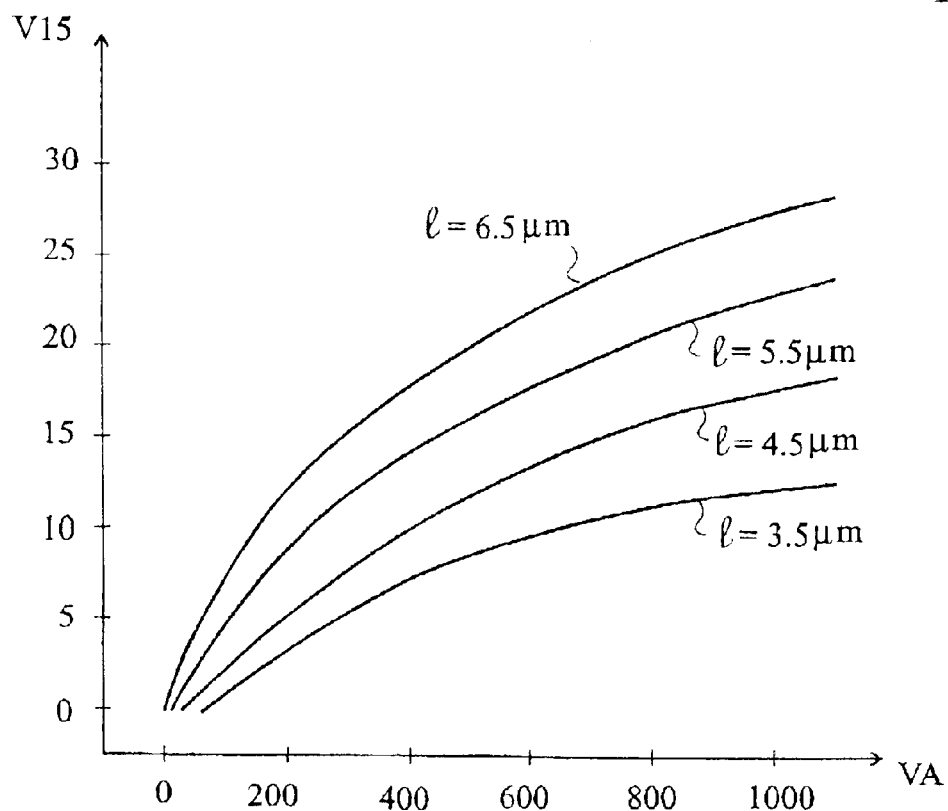
Figure 8A:
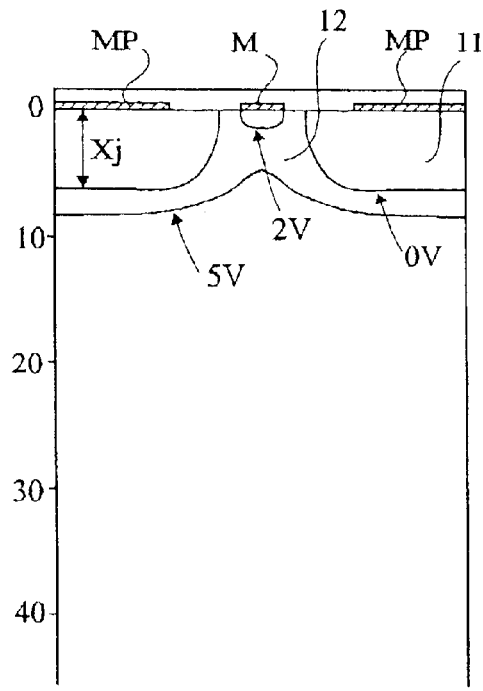
Figure 8B:
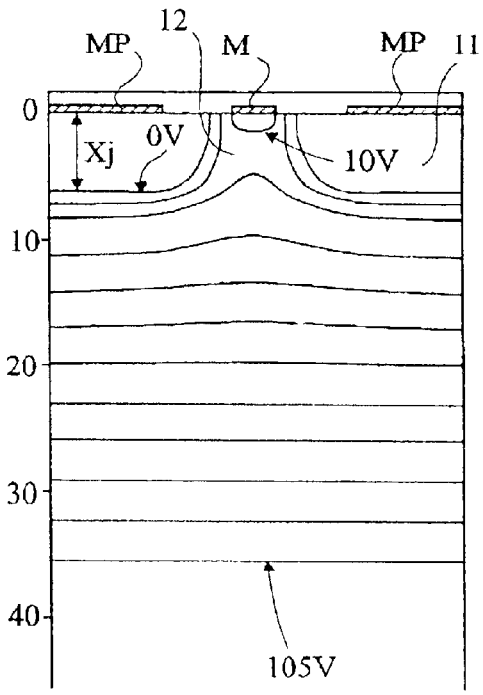
Figure 9:
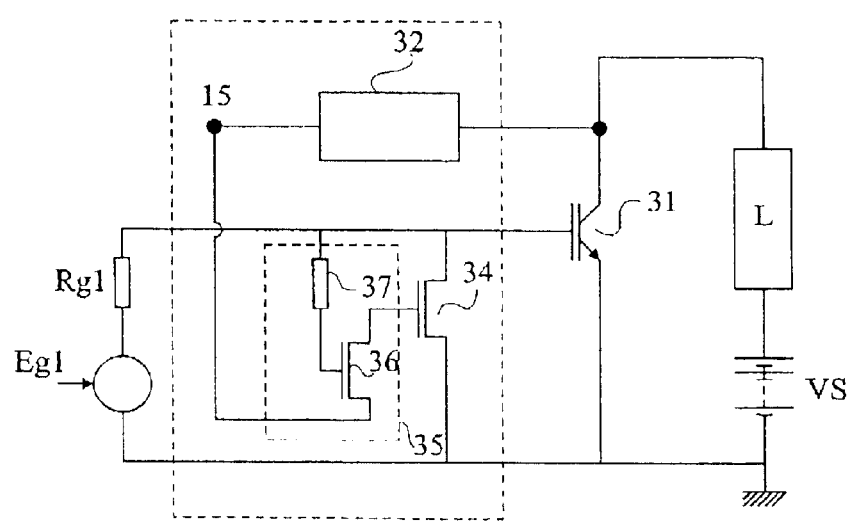
Figure 10:
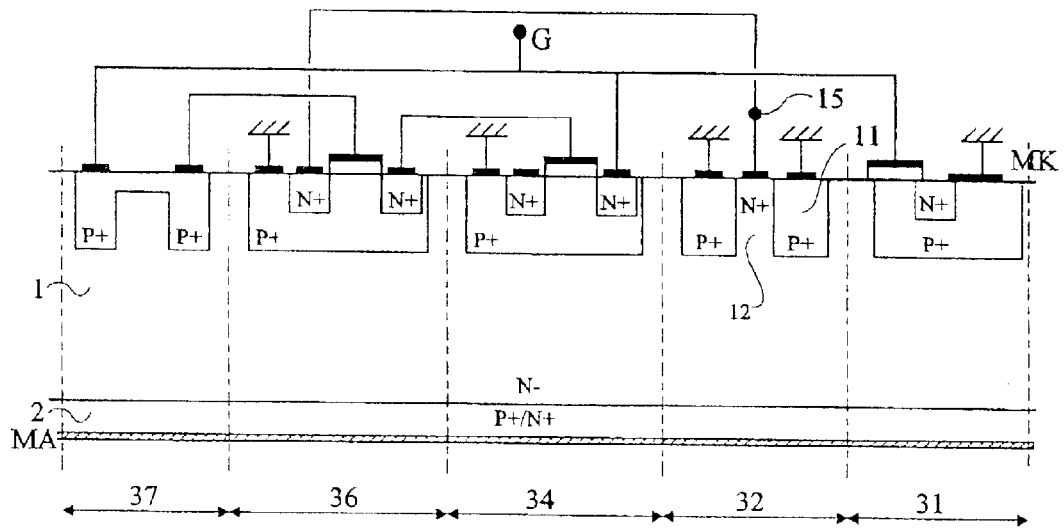
Figure 11:
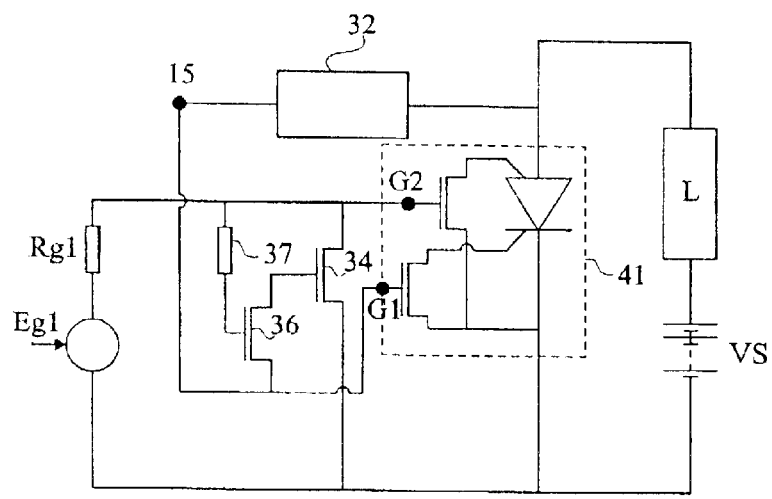

The foregoing objects, features and advantages of the present invention will be discussed in detail in the following non-limiting description of specific embodiments in connection with the accompanying drawings, in which:

FIGS. 1A to 5A show partial cross-section views of vertical power components;

FIGS. 1B to 5B show equivalent diagrams of the structures of FIGS. 1A to 5A;

FIG. 6 shows a simplified cross-section view of an anode voltage sensor according to the present invention;

FIG. 7 shows the voltage across the sensor according to the anode voltage in various conditions;

FIGS. 8A and 8B show examples of the distribution of equipotential surfaces of the sensor according to the present invention in various configurations;

FIG. 9 shows an example of application of the present invention to the protection against a short-circuit of the load in the case of an IGBT transistor;

FIG. 10 shows in a very simplified manner an integrated structure corresponding to the diagram of FIG. 9; and FIG. 11 shows a diagram of a structure of protection against short-circuits in the case where the vertical power component is a gate turn-off MOS thyristor.

Generally, the structures of vertical components of which examples have been given hereabove comprise a lightly-doped N-type substrate 1 having a rear surface coated with an anode metallization MA, with an interposed heavily-doped layer 2 of type N (for example, in the case of a vertical MOS transistor) or of type P (in the case of the other previously-mentioned examples).

A simplified cross-section view of a sensor according to the present invention is illustrated in FIG. 6. This sensor is formed on the front surface side of the component, in substrate 1. It comprises a heavily-doped P-type region 11 delimiting an area 12 of the substrate. Region 11 may be a ring-shaped region completely enclosing region 12 or may correspond to two strips delimiting an intermediary strip corresponding to area 12. A heavily-doped N-type region 13 is formed at the upper portion of area 12 and is coated with a metallization M connected to a terminal 15 on which the desired detection voltage ($V_{15}$) is available. The upper surface of P$^+$-type region(s) 11 is coated with a metallization MP which is connected to a reference voltage which is small as compared to the anode voltage, for example, the reference voltage of the power supply to which the component is to be connected, currently, the ground, this voltage being for example also the cathode voltage.

In FIG. 6, the surface concentration of P$^+$-type regions 11 has been designated as Cs, the junction depth of regions 11 has been designated by Xj, the width of region 12, for example, the distance between two strips 11 or the internal diameter of a ring corresponding to a single region 11, has been designated as l, and the length of metallization M has been designated as e.

When a voltage is applied to anode MA, the voltage on terminal 15 varies in the same direction as this anode voltage. The value of the voltage on terminal 15 and its variation mode depend on the various above-mentioned parameters Cs, Xj, l, and e, as well as on thickness W of the wafer.

As an example, FIG. 7 indicates the variation of voltage $V_{15}$ on terminal 15 of the sensor according to voltage VA on the component's anode in the case where W=300 $\mu$m, Xj=6 $\mu$m, Cs=$2.10^{19}$ at./cm$^3$, and e=4 $\mu$m, for values of l respectively equal to 3.5, 4.5, 5.5, and 6.5 $\mu$m. The case where the anode voltage varies between 0 and 1,000 volts is considered. It can be seen that the sensor voltage increases along with the anode voltage and, for a given anode voltage, with the value of l. Although the sensor voltage is not proportional to the anode voltage, it varies in the same direction and regularly. The sensor voltage thus is a good image of the anode voltage. It may according to the chosen settings vary between 0 and 10 volts and between 0 and 30 volts or more. When parameters Xj and Cs increase, that is, when the size of the diffused region 11 delimiting area 12 where the sensor electrode is located increases, the sensor voltage, for a given value of the anode voltage and of the other parameters, decreases.

It should be clear to those skilled in the art that these curves are explained by the distribution of the equipotential surfaces when the component is powered. FIGS. 8A and 8B show the result of simulations on the shape of these equipotential surfaces, which show that the desired result is achieved. In the case of FIG. 8A, the anode is at a 5-V voltage and in the case of FIG. 8B, the anode is at a 105-V voltage. In the first case, a voltage on the order of 2 V is present at the level of diffused region 13 of the test area, and in the second case, a voltage on the order of 10 V is present. It should be noted that the 0-V equipotential surface substantially corresponds to diffusion depth Xj of regions 11.

Thus, the present invention enables having on the front surface side of a vertical power component an image voltage of the anode/cathode voltage of this component. This image voltage may be used by those skilled in the art for various control or protection applications. An example of application in which the anode voltage is used as a means for detecting a short-circuit in the load, to control the turning-off of the vertical power component, will be described hereafter.

FIG. 9 illustrates such an application of the present invention in which the vertical power component is an IGBT transistor 31 series-connected with a load L and a supply voltage VS. The integrated sensor according to the present invention is schematized in the form of a block 32 interposed between the anode of IGBT transistor 31 and terminal 15 providing the image voltage. Transistor 31 is conventionally associated with a turn-on circuit comprising a resistor Rg1 in series with a controllable voltage source Eg1 likely to provide a positive voltage square when the IGBT transistor is desired to be on. Between the gate and the cathode of IGBT transistor 31 is inserted a turn-off MOS transistor 34 which is connected to detection terminal 15 via a delay circuit 35. Delay circuit 35 for example comprises a MOS transistor 36 in series between the gate of transistor 34 and terminal 15. The gate of transistor 36 is connected to the control terminal of transistor 31 via a resistor 37. The operation of the circuit of FIG. 9 is the following. During on phases of transistor 31, if load L is short-circuited, transistor 31 substantially sees all of supply voltage VS, that is, its anode voltage rises with respect to its cathode voltage. This increase translates as an increase in the image voltage on terminal 15. The turn-on threshold of transistor 34 is chosen so that, as soon as the voltage on terminal 15 exceeds a determined value, transistor 34 turns on. Delay circuit 35 prevents transistor 34 from turning-on just at the beginning of a normal power-on phase. Indeed, when transistor 31 is initially off, the voltage on terminal 15 is higher, then rapidly drops at the beginning of the power-on phase if the load is normal. In the absence of delay circuit 35, transistor 34 would thus turn on at the beginning of each power-on. The time constant linked to the presence of resistor 37 and of the gate capacitance of transistor 36 results in that the signal on terminal 15 is only taken into account after a given delay after the application of a power-on signal. At that time, terminal 15 is at a desired level (low if the load is normal, high if the load is short-circuited).

However, if the load is short-circuited during a normal on phase, the delay circuit no longer intervenes and transistor 34 is immediately turned on, which is desired.

It should be noted that most of the components of FIG. 9 are integrable, as very schematically shown in FIG. 10 where the locations of the various elements of FIG. 9 are shown by their references.

In the diagram of FIG. 9, component 31 may be replaced with other vertical components, provided of course that these components be of gate turn-off type, which is for example not the case for a conventional thyristor. For some components, it will be possible to perform a turning-off immediately before triggering, while this triggering is not complete yet, but it will however not be possible to perform the turning-off once a significant current runs through the main component, if the load is short-circuited in a conduction phase.

FIG. 11 shows a specific application of the present invention to a circuit of gate turn-off MOS thyristor type such as shown in FIGS. 3A and 3B. To turn off this component, the anode-gate and cathode gate terminals G1 and G2 must be simultaneously connected to the cathode. In FIG. 11, the same elements as in FIG. 9 are designated with same reference numerals. Thus, in FIG. 11, component 31 of FIG. 9 is replaced with a component 41 of gate turn-off MOS thyristor type. The control device of gate G2 of this component is identical to that of FIG. 9 and comprises elements 34, 36, and 37. Further, the image voltage of the anode voltage is directly applied to gate G1, to short-circuit the cathode and the cathode gate of the gate turn-off thyristor when the load is short-circuited.

Of course, the present invention is likely to have various alterations, modifications, and improvement which will readily occur to those skilled in the art. In particular, while only vertical power components formed from a lightly-doped N-type substrate have been described, similar components of opposite type formed from a P-type substrate could be formed. The rear surface then is the cathode surface and the detection system becomes a system of detection of the cathode voltage with respect to the anode voltage.

What is claimed is:

1. A control circuit for controlling turning-off of a vertical power component selected from the group comprising the so-called thyristor, MOS, IGBT, PMCT, EST, BRT transistor, MOS thyristor, gate turn-off MOS thyristor, formed in a tightly-doped N-type substrate (1) and having its rear surface (2), coated with a first metallization, which corresponds to an anode of the vertical power component, said circuit comprising:

a voltage sensor comprising, on the front surface side, an area (12) of the substrate surrounded at least partially with a p-type region (11) at a low voltage as compared to an anode voltage, said area (12) being coated with a second metallization (M) in ohmic contact therewith, on which is provided an image of the anode voltage, an output voltage of said sensor being applied to a control terminal of a switch (34) connected between a cathode and a gate terminal of said vertical power component that can be turned off when this gate terminal is connected to the cathode, a delay circuit (35) being interposed between the sensor output voltage and said gate terminal.

2. The control circuit of claim 1, wherein the second metallization (M) is formed on a heavily-doped N-type region (13).

3. The control circuit of claim 1, wherein the anode metallization is formed on a p+-type region (2).

4. The control circuit of claim 1, wherein the delay circuit (35) comprises a MOS transistor (36), the gate of which receives a signal from the sensor and the main circuit of which is connected between the control terminal of said switch and a resistor (37) connected to the control terminal of the vertical component.

* * * * *